United States Patent [19]

Kaplinsky

[11] Patent Number: 5,440,247
[45] Date of Patent: Aug. 8, 1995

[54] FAST CMOS LOGIC WITH PROGRAMMABLE LOGIC CONTROL

[76] Inventor: Cecil H. Kaplinsky, 140 Melville Ave., Palo Alto, Calif. 94301

[21] Appl. No.: 66,555

[22] Filed: May 26, 1993

[51] Int. Cl.⁶ .......................................... H03K 17/173
[52] U.S. Cl. ........................................ 326/39; 326/41
[58] Field of Search ................. 307/465.9; 326/39, 41

[56] References Cited

U.S. PATENT DOCUMENTS

| | | | |
|---|---|---|---|
| 4,124,899 | 11/1978 | Birkner et al. | 364/716 |
| 4,503,387 | 3/1985 | Rutledge | 307/465 |
| 4,525,641 | 6/1985 | Cruz et al. | 307/465 |
| 4,609,986 | 9/1986 | Hartmann et al. | 364/200 |
| 4,652,777 | 3/1987 | Cline | 307/469 |
| 4,684,830 | 8/1987 | Tsui et al. | 307/465 |
| 4,717,912 | 1/1988 | Harvey et al. | 340/825.83 |
| 4,758,756 | 7/1988 | Birkner et al. | 307/465 |
| 4,771,285 | 9/1988 | Agrawal et al. | 340/825.83 |
| 4,789,951 | 12/1988 | Birkner et al. | 364/716 |
| 4,833,349 | 5/1989 | Liu et al. | 307/468 |
| 4,857,773 | 8/1989 | Takata | 307/465 |
| 4,879,481 | 11/1989 | Pathak | 307/465 |
| 4,894,563 | 1/1990 | Gudger | 307/465 |
| 4,912,345 | 3/1990 | Steele et al. | 307/465 |
| 4,965,372 | 10/1990 | Anderson | 307/465 |
| 5,099,150 | 3/1992 | Steele | 307/465 |
| 5,130,574 | 7/1992 | Shen | 307/465 |
| 5,168,178 | 12/1992 | Allen et al. | 307/465 |

Primary Examiner—Edward P. Westin
Assistant Examiner—Andrew Sanders
Attorney, Agent, or Firm—Schneck & McHugh

[57] ABSTRACT

A logic circuit having a programmable first logic circuit stage and a fixed or dedicated combinatorial second logic circuit stage, serving as a macrocell for the first logic circuit stage. At least one input to the logic circuit is connected directly to the second stage, bypassing the first stage. The first stage may be a programmable logic device with a programmable AND plane followed by an OR plane, and is functionally flexible. The second stage has at least two groups of CMOS logic gates arranged in sequence and connected in a fixed manner by hardwiring so as to implement a specified combinatorial logic function that is representable in sum-of-products form, and is fast compared to the first stage. The outputs from the first stage control logic operations of the second stage upon the directly connected input or inputs.

1 Claim, 2 Drawing Sheets

FAST CMOS LOGIC WITH PROGRAMMABLE LOGIC CONTROL

TECHNICAL FIELD

The present invention relates to digital logic circuits, especially CMOS combinatorial logic circuits, and, in particular, to programmable control of such circuits. The invention also relates to multifunctional or programmable logic circuits and devices.

BACKGROUND ART

When designing digital logic circuits with any sort of programmability there is often a tradeoff that must be made between speed and flexibility. Ideally, a circuit would have both high speed and functional flexibility, but, in practice, functional flexibility is generally achieved only at the expense of speed, and vice versa.

In FIG. 1, a programmable logic device having a programmable AND plane 11 followed by an OR plane with macrocells 13 is shown. The device has k inputs received by the AND plane 11 and m outputs provided by the OR plane and macrocells 13. The OR plane 13 itself receives l product term lines from the AND plane 11, and if sequential logic is provided, the device will also have n feedback lines from the macrocells back into the AND plane.

Macrocells for such programmable logic devices provide a number of options related to the device outputs, such as output enable and disable control, inverted or noninverted output signal polarity, stored or nonstored output signals, and selectable output pin utilization by multiple logic array blocks. Further, most macrocells also provide the capability of feeding one or more logic signals back into the programmable AND plane. Examples of typical macrocells are described in U.S. Pat. Nos. 4,124,899; 4,609,986; 4,684,830; 4,717,912; 4,758,746; 4,771,285; 4,789,951; 4,879,481; 4,894,563; and 4,912,345.

By way of illustration, one such macrocell is shown in FIG. 2. A logic signal representing the result of carrying out a specified function by programmable logic is received on a macrocell input line 12 connected, for example, to an output of an OR gate of the programmable logic. The macrocell input 12 is connected to a conductive line 14, which in turn has an inverter 15 connected to a side branch of the conductive line 14. Macrocell input 12 is also connected to an input D of a storage register or flip-flop 16 with complementary outputs Q and $\overline{Q}$ connected to lines 17 and 18. Four versions of the received logic signal are thus derived and presented on inputs 14, 15, 17 and 18 to a multiplexer 19, i.e. a noninverted nonstored signal, an inverted nonstored signal, a noninverted stored signal, and an inverted stored signal. The multiplexer 19 responsive to control signals provided by programmable switches, such as EPROMs, selects one of the four signal variants and transmits that selected signal to its output 20. A tristatable driver 22 responsive to an output enable signal EN transmits the signal to an input/output pin 24. Conductive lines 26, 28 and 30 from the macrocell input 12, register output Q and an input/output pin, respectively, connect to a feedback multiplexer 36. Thus, three signals, a nonstored logic signal, a stored logic signal and an input or output signal, are presented to the multiplexer 36, which selects one of them for feedback along conductive line 42 to the programmable logic, for example, to an input of a programmable AND array. Conductive lines 43 and programmable switches 45a, 45b, etc., can connect pins to an adjacent macrocell for efficient use of pin resources.

Such programmable logic devices are highly flexible and capable of being programmed to carry out a large number of possible logic functions, but are normally slow, because the capacitance on the various signal lines and the large number of programmable switches cause delays when signal levels are changed. A typical throughput for a programmable logic device made using a 1 $\mu$m CMOS process is about 5.5 ns.

In contrast, an example of a conventional hardwired CMOS combinatorial logic circuit, shown in FIG. 3, is significantly faster, with a typical throughput of only 0.75 ns. Such a circuit is fast because it has only a few stages of conventional CMOS logic gates, but it lacks functional flexibility. Similar circuits with logic gates can be given a limited amount of flexibility with nearly the same speed as the fixed function circuit of FIG. 3, by including, for example, one or more multiplexers or by providing logic gates with a programmable number of inputs.

In some applications, one or more signals need to be operated upon quickly with combinatorial logic that varies too much according to a particular situation or set of conditions or that is too complex for simple hardwired logic gates to handle. Generally, programmable logic devices are used for such applications because they are capable of being programmed to carry out any one of a large number of possible logic functions and because they are able to carry out very complex logic. However, such devices are not especially fast, as already noted, and are generally not able to operate quickly on any signal. Even the macrocells, which could be constructed to receive some inputs directly from external pins for output enable or clocking, and which generally are relatively fast, are not expected to perform any combinatorial logic on signals they receive. Any additional logic needed by such signals are provided by feeding back these signals to the programmable logic via feedback lines in the macrocells.

An object of the present invention is to provide digital logic circuit combining the functional flexibility of programmable logic devices and the fast operation of fixed CMOS combinatorial logic to perform flexible logic on a fast input.

DISCLOSURE OF THE INVENTION

The object is met by a logic circuit having a programmable first stage and a nonprogrammable, second stage with at least one input to the circuit being supplied directly to the second stage rather than indirectly via the first stage. The first stage can be any kind of programmable, and thus functionally flexible, logic circuit, especially a programmable logic device (PLD). Such functionally flexible circuits are usually relatively slow because of capacitance associated with interconnects or row and column circuitry. The second stage can be any combinatorial logic circuit with CMOS logic gates hardwired to carry out some fixed logic function. In particular, the second stage could be a new type of dedicated macrocell for a PLD which is capable of performing combinatorial logic on directly received input signals instead of, or in addition to, the output options provided by ordinary macrocells. There could be several of these special combinatorial macrocells in the circuit. Combinatorial logic circuits generally have logic gates selected from AND, NAND, OR, NOR, XOR and XNOR gates, with two or more sequential groups of such gates arranged so as to carry out a function that can be set forth in sum-of-products form or its equivalent. Such gates would have low capacitance compared to the first stage and so the second stage would be faster than the first. The programmable logic of the first stage serves to control the action of the fixed CMOS logic of the second stage, such that inputs supplied directly to the second stage are quickly operated on by the second stage with a degree of flexibility provided by the controlling action of the first stage.

BEST MODE OF CARRYING OUT THE INVENTION

Figure 4:
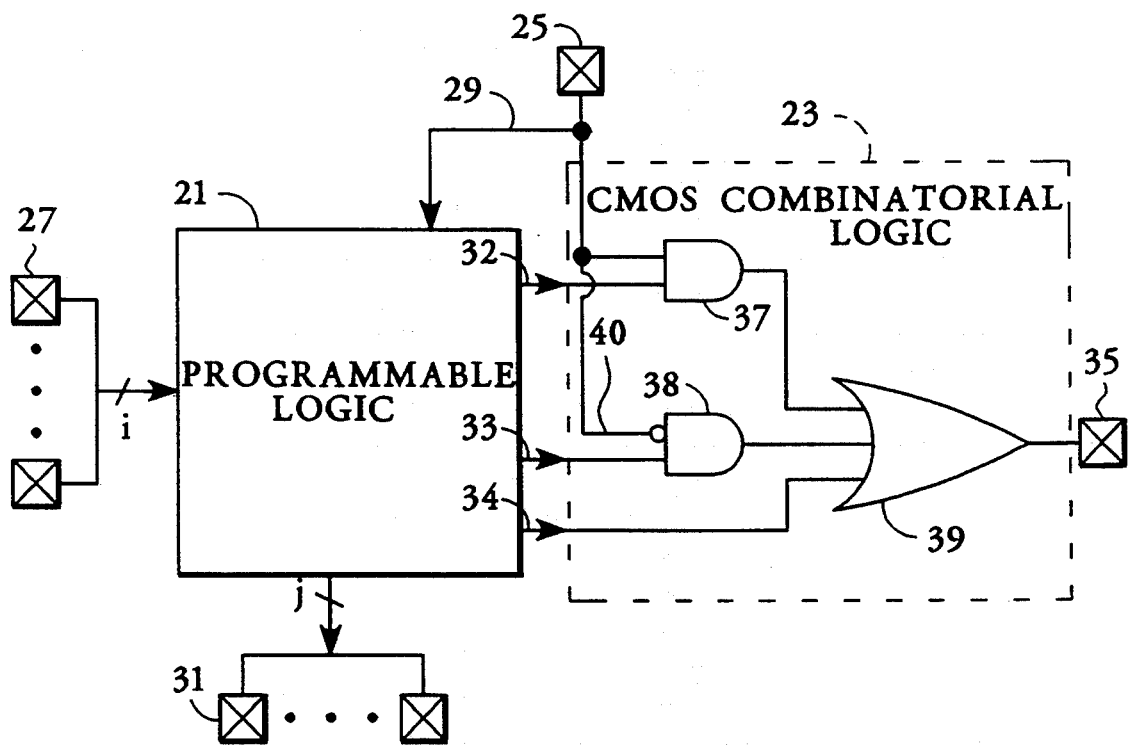
FIG. 4 is a schematic diagram of a logic circuit embodiment constructed in accordance with the present invention.

With reference to FIG. 4, an example of a logic circuit constructed in accord with the present invention has a programmable, but slow, first stage 21 connected to a fixed, but fast, second stage 23 with at least one input 25 directly connected to the second stage 23 rather than connected indirectly via the first stage 21. The two stages 21 and 23 can be on separate chips or may be integrated on the same chip. In the latter case, the second stage 23 could be considered to be a special kind of macrocell for the programmable logic of the first stage 21 that differs from the usual output macrocells 23a that just provide output and feedback options for signals provided by the programmable logic 21. There can be more than one special macrocell or second stage 23, 23', etc., providing additional combinatorial logic for signals provided by the programmable logic stage 21 and for signals supplied directly via inputs 25, 25', etc.

The first stage 21 has multiple inputs 27, which can also include an input line 29 from one or more of the inputs 25 that are directly connected to the second stage 23. The first stage 21 has outputs 31–34, at least some of which are connected as inputs to the second stage 23. The second stage 23, in addition to having inputs 32–34 connected to outputs of the first stage 21 and at least one directly connected input 25, has at least one output 35. While I refer to 'inputs' and 'outputs' here, it will be understood that some of the signal output terminals 31 connected to macrocells 23a might be programmable to act as input terminals instead.

The first stage 21 can be any sort of programmable logic circuit with a significant amount of functional flexibility comparable to that provided by programmable logic devices (PLDs). However, preferably, the first stage 21 will in fact be a programmable logic device with a programmable AND plane followed by an OR plane and macrocells 23a. Examples of such devices include those commonly known as PALs, PLAs and MFLAs. PALs use a fixed array of OR gates for their OR plane, while PLAs use crossing product term lines and sum term lines interconnectable with programmable switches as their OR plane. PLAs, while more flexible than PALs, are also slower. MFLAs use arrays of addressable multibit storage registers connected to logic gates for at least one of their logic planes. Any of the devices may include storage registers in the macrocells 23a, as well as feedback lines from the macrocells 23a back into the programmable AND plane.

Figure 1:
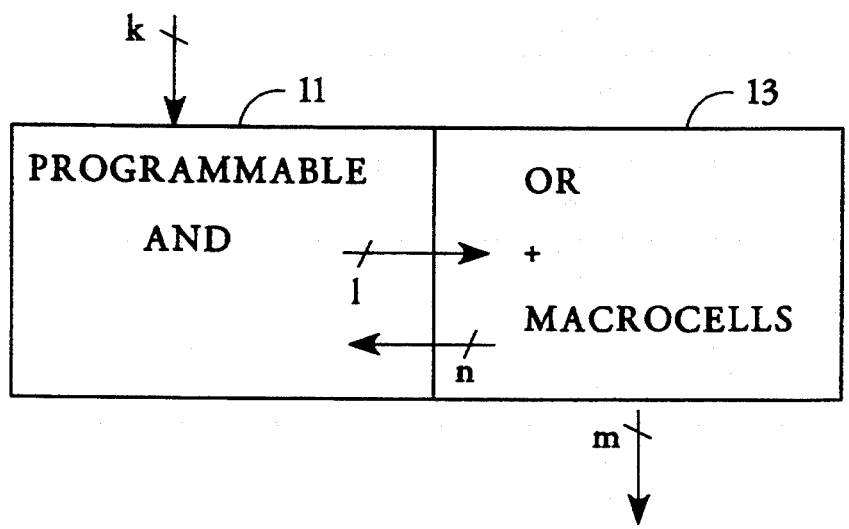
FIG. 1 is a schematic diagram of a programmable logic device of the prior art.
Figure 2:
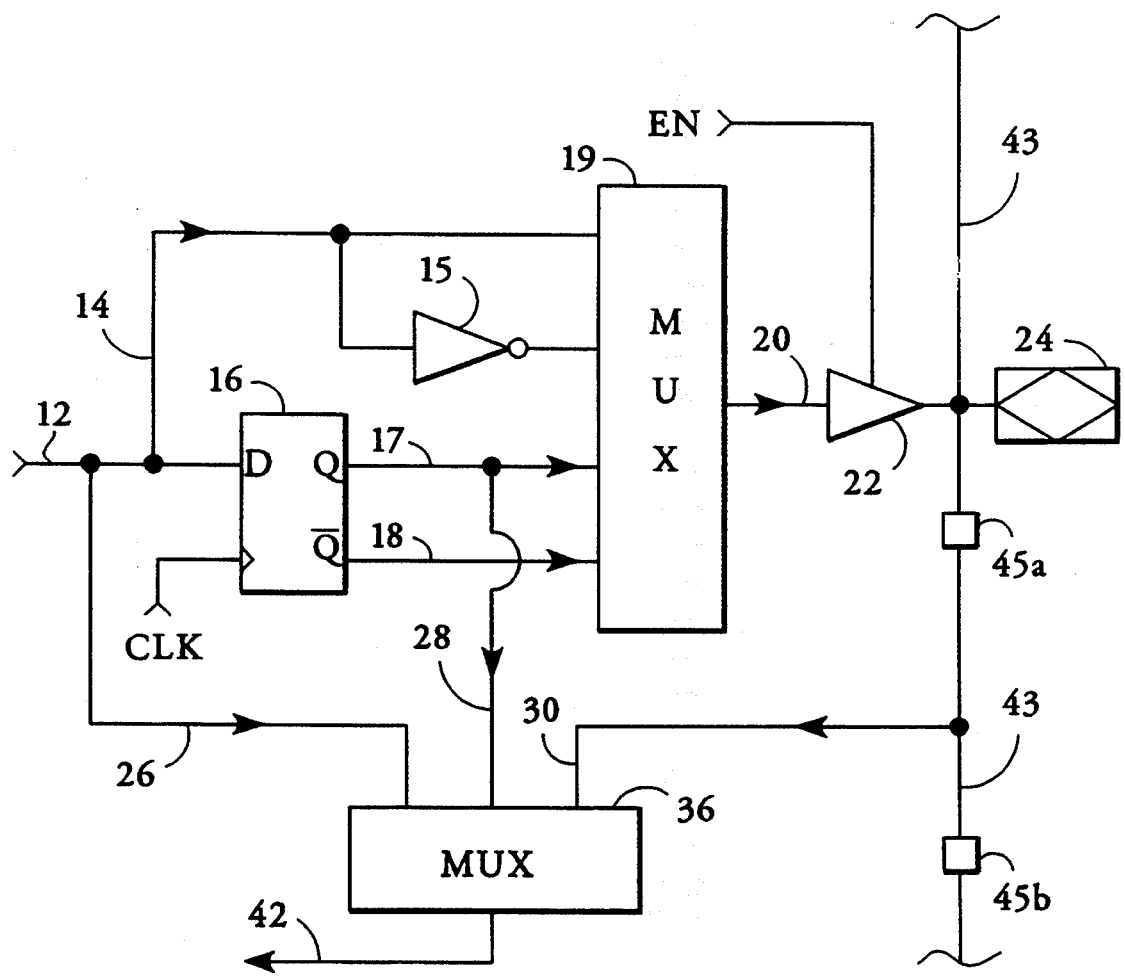
FIG. 2 is a schematic diagram of a typical macrocell unit for the prior art programmable logic device of FIG. 1.
Figure 3:
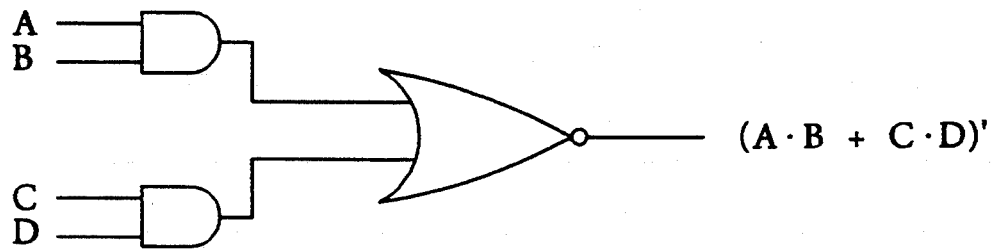
FIG. 3 is a schematic gate level diagram of a typical example of a hardwired CMOS combinatorial logic circuit of the prior art.

The second stage 23 can be any combinatorial logic circuit with CMOS logic gates hardwired to carry out some fixed logic function. A combinatorial logic function F can be represented in sum-of-products form, such as $F=(A \cdot B+C \cdot D)'$, or an equivalent form derived from it with Boolean algebra, such as $F=(A \cdot B)' \cdot (C \cdot D)'$. The function can then be implemented using CMOS logic gates selected from AND, NAND, OR, NOR, XOR and XNOR gates. For example, the function F given above is implemented in FIG. 3 with two AND gates and a NOR gate. It might also be implemented with two NAND gates and an AND gate as per the derived equivalent form of the function given above. Generally two or more groups of logic gates arranged in sequence are required to implement the combinatorial logic function. In FIG. 3, for example, there is a group of two AND gates followed by a group of one NOR gate. This is shown also as a second combinatorial macrocell 23' of the second stage with inputs 32', 33' and 34' from the programmable logic stage 21 corresponding to inputs A, B, and C in FIG. 3 and with a direct input 25' corresponding to the input D in FIG. 3. The output of the NOR gate is provided to output 35' of the logic circuit. In the example shown in FIG. 4, a first combinatorial macrocell 23 of the second stage includes a group of two AND gates 37 and 38 followed by a group of one OR gate 39. Three inputs 32–34 to this second stage logic 23 are received from outputs of the first stage 21 and respectively connected to inputs of logic gates 37–39. Another input 25 is provided directly to second stage 23 and connected to other inputs of logic gates 37 and 38. Note that some logic gate inputs may be inverted to change their polarity, as in the input 40 to AND gate 38, and that some, but not all, inputs to the second stage 23 can bypass one or more groups of logic gates, as in the input 34 bypassing of the group of AND gates 37 and 38. The logic function implemented by the combinatorial macrocell 23 in FIG. 4 is $G=A \cdot B+A' \cdot C+D$ where A, B, C and D represent inputs 25 and 32–34, respectively. The output of the OR gate 39 is provided to the output 35 of the logic circuit. One or more of the combinatorial macrocells 23, 23', etc. might also have feedback 42' to the programmable logic 21.

An example of a use for such two-stage logic circuits of the present invention is memory access by a microprocessor. An address provided by a microprocessor may be decoded by the programmable logic in the first stage 21 of the circuit. Usually, an address strobe signal is supplied after some delayed time period after the providing of the address. One would not want the address strobe signal to be combined in the slow first stage 21 since this would further delay access to the requested memory address. Rather, one would want this input to go through the logic circuit quickly. The address strobe signal is thus applied to an input 25 that is connected directly to the fast second stage 23 of the logic circuit, bypassing the slower first stage 21. The combinatorial circuit in FIG. 3 is one that might be used for the second stage 23' with the input A being connected to the fast input 25' to receive the address strobe signal and the inputs B–D connected to the first stage outputs 32'–34' to receive the decoded or partially decoded address.

Another application might require that a signal received by the fast input 25 to the second logic stage 23 be transmitted as is or inverted, with the polarity depending on a complex condition requiring programmable logic 21. The first stage 21 then controls the polarity of the signal received at the fast input 25. Other applications might require a signal received directly by the second logic stage 23 at a fast input 25 be transmitted or blocked according to a complex logic function implemented in the programmable first stage. As noted already, the signals received on the fast input 25 could also be input into the first stage logic 21 via an input line 29. Essentially, the programmable logic 21 controls the action of the fixed combinatorial logic 23, permitting fast, but functionally flexible, operation on one or more input signals that need to go through the logic quickly.

I claim:

1. A two-stage logic circuit comprising a programmable first logic circuit stage having a set of inputs and outputs, said first logic circuit stage being configurable by programming to carry out a specified logic function in response to input signals received by said set of inputs and to provide output signals representing a result of said specified logic function on said outputs of said first logic circuit stage, a fixed combinatorial second logic circuit stage having a first set of inputs connected to at least some of said outputs of said first logic circuit stage, at least one other direct input in a second set of inputs bypassing said first logic circuit stage and connected directly to said second logic circuit stage, and at least one output, said second logic circuit stage including at least two groups of logic gates arranged in sequence and connected together and to said first set of inputs and also to said at least one other input in a fixed manner by hardwiring to implement a specified combinatorial logic function that is representable in sum-of-products form and to provide a result of said function on said at least one output of said second logic circuit stage, wherein said output signals provided on said outputs of said programmable first logic circuit stage to said first set of inputs of said second logic circuit stage control logic operations of said fixed combinatorial second logic circuit stage upon signals received by said at least one other input connected directly to said second logic circuit stage, and wherein said at least one other input of said second logic circuit stage also forms at least one input to said first logic circuit stage.

* * * * *